United States Patent
Cheng et al.

(10) Patent No.: US 7,545,001 B2
(45) Date of Patent: Jun. 9, 2009

(54) SEMICONDUCTOR DEVICE HAVING HIGH DRIVE CURRENT AND METHOD OF MANUFACTURE THEREFOR

(75) Inventors: Shui-Ming Cheng, Hsin-Chu (TW); Ka-Hing Fung, Hsin-Chu (TW); Kuan Lun Cheng, Hsin-Chu (TW); Yi-Ming Sheu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/722,218

(22) Filed: Nov. 25, 2003

(65) Prior Publication Data

US 2005/0110082 A1 May 26, 2005

(51) Int. Cl.
*H01L 23/62* (2006.01)

(52) U.S. Cl. .................. 257/357; 257/365; 257/371; 438/197; 438/199

(58) Field of Classification Search .......... 257/357, 257/365, 371; 438/197, 199
See application file for complete search history.

(56) References Cited

U.S. PATENT DOCUMENTS

| | | | | |
|---|---|---|---|---|
| 5,428,239 A * | 6/1995 | Okumura et al. | ............ | 257/371 |
| 5,913,115 A * | 6/1999 | Biebl et al. | ............ | 438/222 |
| 5,963,803 A * | 10/1999 | Dawson et al. | ............ | 438/231 |
| 6,187,641 B1 * | 2/2001 | Rodder et al. | ............ | 438/299 |
| 6,194,258 B1 * | 2/2001 | Wuu | ............ | 438/200 |
| 6,274,894 B1 * | 8/2001 | Wieczorek et al. | ......... | 257/192 |
| 6,348,390 B1 * | 2/2002 | Wu | ............ | 438/305 |
| 6,524,938 B1 * | 2/2003 | Tao et al. | ............ | 438/585 |
| 6,774,409 B2 * | 8/2004 | Baba et al. | ............ | 257/189 |
| 2003/0080361 A1 | 5/2003 | Murthy et al. | | |
| 2003/0230811 A1 * | 12/2003 | Kim | ............ | 257/758 |
| 2004/0173815 A1 * | 9/2004 | Yeo et al. | ............ | 257/192 |
| 2004/0175872 A1 * | 9/2004 | Yeo et al. | ............ | 438/154 |
| 2004/0195646 A1 * | 10/2004 | Yeo et al. | ............ | 257/527 |
| 2004/0262683 A1 * | 12/2004 | Bohr et al. | ............ | 257/338 |
| 2005/0079660 A1 * | 4/2005 | Murthy et al. | ............ | 438/197 |
| 2005/0093021 A1 * | 5/2005 | Ouyang et al. | ............ | 257/194 |
| 2006/0189056 A1 * | 8/2006 | Ko et al. | ............ | 438/197 |

OTHER PUBLICATIONS

Shimizu et al. Local mechanical stress control, IEDM 2001, pp. 433-436.*
Shimizu, A., et al., "Local Mechanical-Stress Control (LMC): A New Technique for CMOS-Performance Enhancement", IEEE, 2001, 4 pages.

* cited by examiner

*Primary Examiner*—Phat X Cao
(74) *Attorney, Agent, or Firm*—Haynes and Boone, LLP

(57) ABSTRACT

A semiconductor device including an isolation region located in a substrate, an NMOS device located partially over a surface of the substrate, and a PMOS device isolated from the NMOS device by the isolation region and located partially over the surface. A first one of the NMOS and PMOS devices includes one of: (1) first source/drain regions recessed within the surface; and (2) first source/drain regions extending from the surface. A second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface.

39 Claims, 2 Drawing Sheets

SEMICONDUCTOR DEVICE HAVING HIGH DRIVE CURRENT AND METHOD OF MANUFACTURE THEREFOR

BACKGROUND

The present disclosure relates generally to semiconductor devices and, more specifically, to a semiconductor device having a high drive current, a method of manufacture thereof, and an integrated circuit device incorporating the same.

Increasing tensile or compressive stress in a semiconductor device substrate can improve drive current. For example, increasing the tensile stress in the substrate can improve the performance of n-channel metal-oxide-semiconductor (NMOS) devices. Similarly, increasing the compressive stress in the substrate can improve the performance of p-channel metal-oxide-semiconductor (PMOS) devices. However, such tuning of the stress in a substrate incorporating NMOS and PMOS devices, such as by increasing tensile stress in substrate regions containing NMOS devices and increasing compressive stress in substrate regions containing PMOS devices, is difficult.

Some applications have realized limited localized stress tuning by employing different materials for adjacent shallow trench isolation (STI) regions and other isolation structures. Stress tuning can also be accomplished by employing different materials for silicide and other contact layers. Etch stop layers remaining in the device structure after being employed as etching endpoints have also been employed for substrate stress tuning. However, such past attempts accomplished only increased tensile stress or increased compressive stress. That is, the performance of PMOS devices in a complimentary metal-oxide-semiconductor (CMOS) scheme were improved, or the performance of NMOS devices in the CMOS scheme were improved, but the past attempts failed to simultaneously improve device performance of both the PMOS and NMOS devices.

Accordingly, what is needed is a semiconductor device, a method of manufacture thereof and an integrated circuit incorporating the same that addresses the issues discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
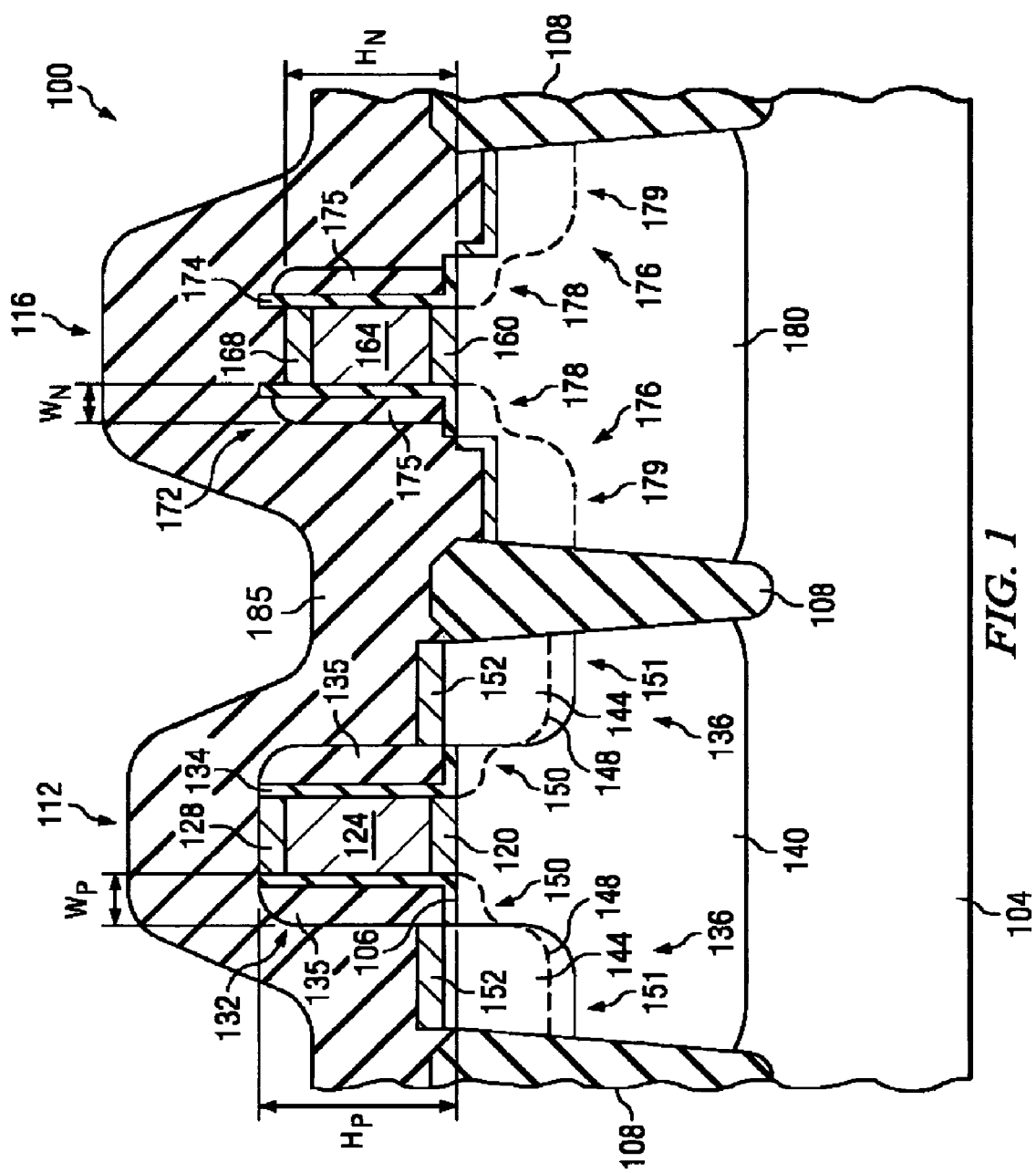
FIG. 1 illustrates a sectional view of one embodiment of a semiconductor device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is one embodiment of a semiconductor device 100 constructed according to aspects of the present disclosure. The semiconductor device 100 includes a substrate 104 having one or more isolation structures 108 formed therein. The semiconductor device 100 also includes a PMOS device 112 and an NMOS device 116 that are electrically isolated by one of the isolation structures 108.

The substrate 104 may comprise an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or any combination thereof. The substrate 104 may also comprise a semiconductor material on an insulator, such as silicon-on-insulator (SOI), or a thin film transistor (TFT). In one embodiment, the substrate 104 may also include a doped epitaxial layer. The substrate 104 may also include a multiple silicon structure or a multilayer, compound semiconductor structure. Although not limited within the scope of the present disclosure, the channel direction of the substrate 104 in some embodiments may be <100> or <110> and the crystalline orientation of the substrate 104 in some embodiments may be (100) or (110) or (111).

The isolation structures 108 may be formed by local oxidation of silicon (LOCOS), shallow trench isolation (STI) and/or other processes. For example, the isolation structures 108 may be formed by etching or otherwise patterning recesses in the substrate 104 and subsequently filling the recesses with silicon dioxide and/or other electrically insulating materials, possibly by chemical vapor deposition.

The PMOS device 112 includes a gate dielectric layer 120 over the substrate 104, a gate electrode 124 over the gate dielectric layer 120, and possibly a gate contact 128 over the gate electrode 124. The PMOS device 112 also includes spacers 132 on opposing sides of the gate electrode 124 and over the substrate 104, and source/drain regions 136 on opposing sides of the gate electrode 124 and at least partially within the substrate 104. The PMOS device 112 may also include or be at least partially formed in an n-doped region 140 of the substrate 104. The n-doped region 140 may be formed by ion implantation of phosphorous, antimony, arsenic and/or other impurities or dopants.

The gate dielectric layer 120 may be formed by thermal oxidation, atomic layer deposition (ALD), chemical vapor deposition (CVD), physical vapor deposition (PVD), plasma enhanced CVD (PECVD) and/or other processes. Moreover, although not limited by the scope of the present disclosure, the gate dielectric layer 120 may comprise silicon oxide, silicon oxynitride, or a high-k dielectric, such as hafnium oxide, zirconium oxide, aluminum oxide, a hafnium dioxide-alumina ($HfO_2$-$Al_2O_3$) alloy, and/or combinations thereof. The gate dielectric layer may have a thickness ranging between about 0.5 nm and about 10 nm.

The gate electrode 124 may be formed by CVD, PVD, PECVD, ALD and/or other processes, and may comprise doped polysilicon, silicon and germanium polysilicon, titanium nitride, tantalum nitride, nickel silicide, cobalt silicide, silicided polysilicon and/or other metals. The height of gate electrode 124 may range between about 10 nm and about 200 nm. After forming the gate electrode 124 (and possibly other subsequent process steps), the gate electrode 124 may also be processed to form an ohmic contact, such as the gate contact 128 discussed above. The gate contact 128 may be formed by CVD, PVD, salicidation and/or other processes, and may comprise nickel silicide, cobalt silicide, tungsten silicide, tantalum silicide, titanium silicide, platinum silicide, erbium silicide, palladium silicide and/or combinations thereof. The gate dielectric layer 120 and the gate electrode 124, and possibly the gate contact 128, collectively have a combined height $H_P$ above a surface 106 of the substrate 104.

The spacers 132 may be formed by CVD, PVD, thermal oxidation and/or other processes, and may comprise one or more dielectric materials such as silicon nitride, silicon oxide, silicon carbide, silicon oxynitride and/or combinations thereof. The spacers 132 may each have a width $W_P$ extending from the gate electrode 124. The width of spacers 132 may range between about 5 nm and about 100 nm.

The spacers 132 may also comprise more than one layer. For example, as in the illustrated embodiment, the spacers 132 may comprise stacked first and second layers 134, 135. The first layer 134 may conform to a portion of the substrate 104 and one side of the stack formed by the gate dielectric layer 120, the gate electrode 124 and possibly the gate contact 128. The second layer 135 may be substantially bound by the first layer 134. Of course, the spacers 132 may comprise other layers in addition to and/or as an alternative to those described herein.

The source/drain regions 136 may be of conventional composition and fabrication. For example, the source/drain regions 136 may comprise doped portions of the substrate 104 which may be formed by ion implantation of boron, boron difluoride (BF2), or other dopants, and/or in-situ doped of boron or other dopants. In such embodiments, the source/drain regions 136 may be substantially coplanar with the surface 106 of the substrate 104. However, as in the illustrated embodiment, the source/drain regions 136 may extend above the substrate surface 106. In such embodiments, the source/drain regions 136 may comprise silicon, silicon germanium, silicon carbide, gallium arsenide and/or other materials, and may be formed by dry etching or otherwise patterning recesses in the substrate 104 and subsequently filling the recesses with such materials. For example, the recess may be epitaxially filled with silicon germanium, possibly by exposing the recesses to a precursor comprising germanium. The filled recesses are herein designated by the reference numeral 144. The depth of recessed source/drain region may range between about 5 nm and about 100 nm. Moreover, as in the illustrated embodiment, the recesses 144 may be filled to a height above the surface 106 of the substrate 104, such that the source/drain regions 136 may be raised source/drain regions. The height of raised source/drain regions may range between about 5 nm and about 100 nm.

The doping processes discussed above that may be employed to form the source/drain regions 136 may also be performed after the filled recesses 144 are formed, or simultaneous with forming the filled recesses 144, thereby forming a doping profile 148 further optimizing the conductivity of the source/drain regions 136. Moreover, such a doping profile 148 may be accomplished in more than one doping procedure. For example, as in the illustrated embodiment, the doping profile 148 may include lightly doped regions 150 adjacent the spacers 132 and heavier doped regions 151 within the filled recesses 144, wherein the lightly doped regions 150 may be formed by a first doping process and the heavier doped regions 151 may be formed by a second, subsequent doping process. The lightly doped regions 150 may be formed by implanting boron, boron diflourine (BF$_2$), and/or other dopants. The energy of ion implantation of boron may range between about 0.2 keV and about 20 keV and the dose may range between about $5 \times 10^{14}$ and about $5 \times 10^{15}$ cm$^{-2}$. The heavier doped regions 151 may be formed by ion implantation or in-situ doped of boron, boron difluoride (BF$_2$), and/or other dopants. The energy of ion implant of boron may range between about 0.2 keV are about 50 keV and the dose of ion implantation of boron may range between about $1 \times 10^{15}$ and about $5 \times 10^{15}$ cm$^{-2}$.

After their formation, the source/drain regions 136 may also be processed to form contacts 152 thereon. The contacts 152 may be substantially similar in composition and manufacture to the gate contact 128, and may be formed simultaneously with the gate contact 128.

The NMOS device 116 includes a gate dielectric layer 160 over the substrate 104, a gate electrode 164 over the gate dielectric layer 160, and possibly a gate contact 168 over the gate electrode 164. The NMOS device 116 also includes spacers 172 on opposing sides of the gate electrode 164 over the substrate 104, and source/drain regions 176 on opposing sides of the gate electrode 164 at least partially within the substrate 104. The NMOS device 116 may also include or be at least partially formed in a p-doped region 180 of the substrate 104. The p-doped region 180 may be formed by ion implantation of boron, boron difluoride (BF$_2$), indium and/or other impurities or dopants.

The gate dielectric layer 160, gate electrode 164 and gate contact 168 are substantially similar in composition and manufacture to the gate dielectric layer 120, gate electrode 124 and gate contact 128. In one embodiment, the gate dielectric layers 120, 160 are formed simultaneously, the gate electrodes 124, 164 are formed simultaneously, and the gate contacts 128, 168 are formed simultaneously. However, in one embodiment, the gate dielectric layer 160 and the gate electrode 164, and possibly the gate contact 168, have a combined height $H_N$ above the surface 106 of the substrate 104. The height $H_N$ may be substantially equal to the combined height $H_P$ discussed above. However, in one embodiment, the height $H_N$ may be substantially less than the combined height $H_P$. For example, the height $H_N$ may be at least 10-20% less than the height $H_P$. In one embodiment, the height $H_N$ is 30% less than the height $H_P$. In another embodiment, the height $H_N$ may be substantially greater than the combined height $H_P$. For example, the height $H_N$ may be at least 10-20% greater than the height $H_P$. In one embodiment, the height $H_N$ is 30% greater than the height $H_P$.

The spacers 172 are substantially similar in composition and manufacture to the spacers 132, and may be formed simultaneously with the spacers 132. For example, the spacers 172 may comprise a first layer 174 at least spanning the height $H_N$ and a portion of the substrate surface 106, and a second layer 175 substantially bound by the first layer 174. The spacers 172 have a width $W_N$ extending from the gate electrode 164 that is substantially equal to the width $W_P$ of the spacers 132. However, in one embodiment, the spacers 172 have a width $W_N$ that is substantially less than the width $W_P$ of the spacers 132. For example, the width $W_N$ may be at least 10-20% less than the width $W_P$. In one embodiment, the width $W_N$ is 50% less than the width $W_P$. In another embodiment, the spacers 172 have a width $W_N$ that is substantially greater than the width $W_P$ of the spacers 132. For example, the width $W_N$ may be at least 10-20% greater than the width $W_P$. In one embodiment, the width $W_N$ is 50% greater the width $W_P$.

The source/drain regions 176 may be substantially similar in composition and manufacture to the source/drain regions 136. However, as in the illustrated embodiment, the source/drain regions 176 may be recessed source/drain regions. That is, the source/drain regions 176 may be formed by dry etching or otherwise patterned recesses in the substrate 104 prior to performing the ion implantation or other processes employed to form a doping profile. The source/drain regions 176 may also have a doping profile that is similar to the doping profile of the source/drain regions 136, in that the source/drain regions 176 may include lightly doped regions 178 and heavily doped regions 179. The lightly doped regions 178 may be formed by implanting arsenic, phosphorous, antimony, and/or other dopants. The energy of ion implantation of arsenic may range between about 0.5 keV and about 10 keV and the dose may range between about $5 \times 10^{14}$ and about $5 \times 10^{15}$ cm$^{-2}$. The heavier doped regions 179 may be formed by ion implantation or in-situ doped of arsenic, phosphorous, antimony, and/or other dopants. The energy of ion implant of arsenic may range between about 5 keV and about 50 keV and the dose of ion implantation of boron may range between about $1 \times 10^{15}$ and about $5 \times 10^{15}$ cm$^{-2}$.

In one embodiment, the source/drain regions 136 may be recessed source/drain regions and the source/drain regions 176 may be raised source/drain regions, in contrast to the illustrated embodiment. In another embodiment, the source/drain regions 136 may be recessed source/drain regions and the source/drain regions 176 may be coplanar with the substrate 104. In another embodiment, the source/drain regions 136 may be raised source/drain regions and the source/drain regions 176 may be coplanar with the substrate 104. In another embodiment, the source/drain regions 176 may be recessed source/drain regions and the source/drain regions 136 may be coplanar with the substrate 104. In another embodiment, the source/drain regions 176 may be raised source/drain regions and the source/drain regions 136 may be coplanar with the substrate 104.

The semiconductor device 100 may also include an etch stop layer 185. The etch stop layer 185 may comprise silicon nitride (e.g., Si3N4), silicon oxynitride (e.g., SiON), silicon carbide, silicon dioxide and/or other materials, and may be formed by blanket or selective deposition by CVD, PVD, thermal oxidation and/or other processes. The etch stop layer 185 may be a tensile or compressive film, wherein a stress level may range between about +0.01 and about +2 GPa for tensile film and between about −0.01 and about −2 GPa for compressive film. The tensile or compressive nature of the etch stop layer 185 may impart strain within the source/drain regions 136, 176. Moreover, the strain induced in the source/drain region 136 by the etch stop layer 185 may be substantially different in magnitude that the strain induced in the source/drain region 176 by the etch stop layer 185. For example, the strain induced in the source/drain regions 136, 176 may vary by 10-20% in magnitude. In one embodiment, the strain induced in the source/drain regions 136 may be tensile and the strain induced in the source/drain regions 176 may be compressive. In another embodiment, the strain induced in the source/drain regions 136 may be compressive and the strain induced in the source/drain regions 176 may be tensile. The thickness of etch stop layer 185 may range between about 5 nm and about 200 nm.

Figure 2:
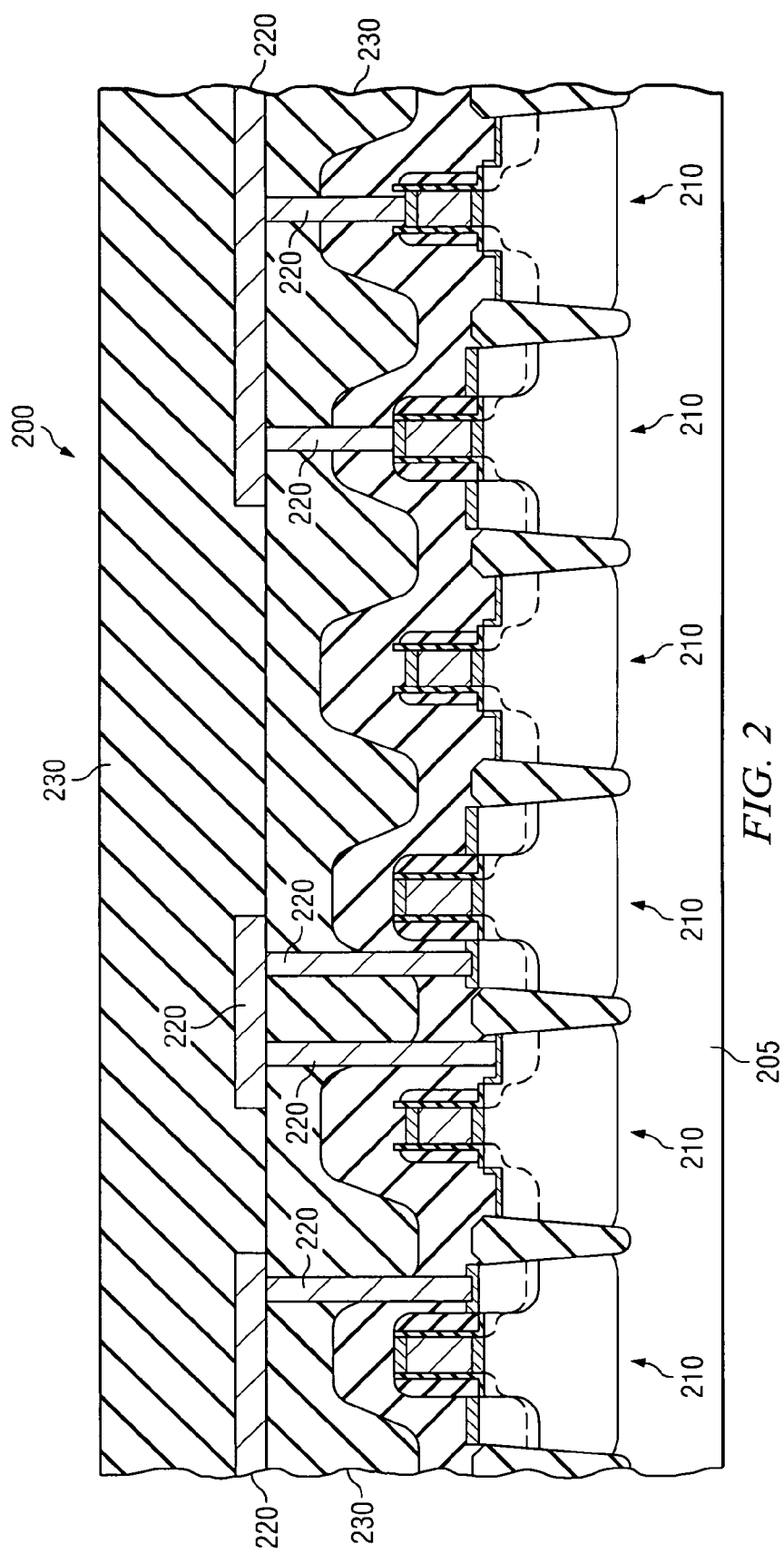
FIG. 2 illustrates sectional view of one embodiment of an integrated circuit device constructed according to aspects of the present disclosure.

Referring to FIG. 2, illustrated is one embodiment of an integrated circuit device 200 constructed according to aspects of the present disclosure. The integrated circuit device 200 is one environment in which embodiments of the semiconductor device 100 shown in FIG. 1 may be implemented. For example, the integrated circuit device 200 includes a plurality of semiconductor devices 210, ones of which may be substantially similar to the semiconductor device 100 shown in FIG. 1. The semiconductor devices 210 may form a logic circuit or other transistor array, including a one-, two- or three-dimensional array, and may be oriented in one or more rows and/or one or more columns, such as on or over a substrate 205 in which the substrate 205 is substantially planar. In one environment, the substrate 205 may be substantially spherical or have a spherical or otherwise rounded surface on, over or from which the plurality semiconductor devices 210 may be formed.

The integrated circuit device 200 also includes interconnects 220 extending along and/or through one or more dielectric layers 230 to ones of the plurality of semiconductor devices 210. The dielectric layer 230 may comprise silicon dioxide, fluoride-doped silicate glass (FSG), Black Diamond® (a product of Applied Materials of Santa Clara, Calif.), Xerogel, Aerogel, amorphous fluorinated carbon, Parylene, BCB, Flare, and SiLK, and/or other materials, and may be formed by CVD, PECVD, ALD, PVD, spin-on coating and/or other processes. The interconnects 220 may comprise copper, tungsten, gold, aluminum, carbon nano-tubes, carbon fullerenes, refractory metals, alloys of these materials and/or other materials, and may be formed by CVD, PECVD, ALD, PVD and/or other processes. The interconnects 220 may also include more than one layer. For example, each interconnect 220 may comprise an adhesion layer possibly comprising titanium, titanium nitride, tantalum or tantalum nitride, a barrier layer possibly comprising titanium nitride or tantalum nitride, and a bulk conductive layer comprising copper, tungsten, aluminum, or aluminum alloy.

Thus, the present disclosure introduces a semiconductor device including, in one embodiment, an isolation region located in a substrate, an NMOS device located partially over a surface of the substrate, and a PMOS device isolated from the NMOS device by the isolation region and located partially over the surface. A first one of the NMOS and PMOS devices includes one of: (1) first source/drain regions recessed within the surface; and (2) first source/drain regions extending from the surface. A second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface.

In another embodiment, semiconductor device constructed according to aspects of the present disclosure comprises an isolation region located in a substrate, an NMOS device located partially over a surface of the substrate, and a PMOS device isolated from the NMOS device by the isolation region and located partially over the surface. A first one of the NMOS and PMOS devices includes: (1) first source/drain regions located at least partially in the substrate; and (2) a first gate interposing the first source/drain regions and having a first gate height over the surface. A second one of the NMOS and PMOS devices includes: (1) second source/drain regions located at least partially in the substrate; and (2) a second gate interposing the second source/drain regions and having a second gate height over the surface, wherein the first and second gate heights are substantially different.

Another embodiment of a semiconductor device constructed according to aspects of the present disclosure includes an isolation region located in a substrate, an NMOS device located partially over a surface of the substrate, and a PMOS device isolated from the NMOS device by the isolation region and located partially over the surface. A first one of the NMOS and PMOS devices includes: (1) first source/drain regions located at least partially in the substrate; (2) a first gate interposing the first source/drain regions; and (3) first spacers on opposing sides of the first gate and each extending from the first gate to a first width. A second one of the NMOS and PMOS devices includes: (1) second source/drain regions located at least partially in the substrate; (2) a second gate interposing the second source/drain regions; and (3) second spacers on opposing sides of the second gate and each extending from the second gate to a second width, wherein the first and second widths are substantially different.

In another embodiment, a semiconductor device constructed according to aspects of the present disclosure includes an isolation region located in a substrate, an NMOS device located partially over a surface of the substrate, and a PMOS device isolated from the NMOS device by the isolation region and located partially over the surface. A first one of the NMOS and PMOS devices includes one of: (1) first source/drain regions located at least partially within the substrate and comprising SiC; and (2) first source/drain regions located at least partially within the substrate and comprising SiGe. A second one of the NMOS and PMOS devices includes one of: (1) second source/drain regions located at least partially within the substrate and comprising SiC wherein the first source/drain regions comprise SiGe; (2) second source/drain regions located at least partially within the substrate and comprising SiGe wherein the first source/drain regions comprise SiC; and (3) second source/drain regions located at least partially within the substrate and substantially not comprising either of SiC and SiGe.

The present disclosure also introduces a method of manufacturing semiconductor device. In one embodiment, the method includes forming an isolation region located in a substrate, forming an NMOS device located partially over a surface of the substrate, and forming a PMOS device isolated from the NMOS device by the isolation region and located partially over the surface. A first one of the NMOS and PMOS devices includes one of: (1) first source/drain regions recessed within the surface; and (2) first source/drain regions extending from the surface. A second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface.

An integrated circuit device is also provided in the present disclosure. In one embodiment, the integrated circuit device includes a plurality of semiconductor devices each including an isolation region located in a substrate, an NMOS device located partially over a surface of the substrate, and a PMOS device isolated from the NMOS device by the isolation region and located partially over the surface. In each of ones of the plurality of semiconductor devices, a first one of the NMOS and PMOS devices includes one of: (1) first source/drain regions recessed within the surface; and (2) first source/drain regions extending from the surface. In each of the ones of the plurality of semiconductor devices, a second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface. The integrated circuit device also includes a plurality of interconnects connecting ones of the plurality of semiconductor devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
an isolation region located in a substrate;
an NMOS device located partially over a surface of the substrate; and
a PMOS device isolated from the NMOS device by the isolation region and located partially over the surface;
an etch stop layer on the substrate overlying the NMOS device and the PMOS device; and
wherein a first one of the NMOS and PMOS devices includes a gate and a first source/drain regions, wherein the first source/drain regions are recessed and disposed entirely below the surface of the substrate and wherein the first source/drain regions are recessed such that the etch stop layer overlying the gate and the first source/drain regions extends below an interface of the gate and the surface; and
wherein a second one of the NMOS and PMOS devices includes second source/drain regions at least partially extending above the surface of the substrate, and wherein the etch stop layer imparts a first strain within the first source/drain region and a second strain within the second source/drain region, the first and second strain being different in magnitude.

2. The semiconductor device of claim 1 wherein:
a high-gate one of the NMOS and PMOS devices includes a first gate interposing associated source/drain regions and having a first height over the surface; and
a low-gate one of the NMOS and PMOS devices includes a second gate interposing associated source/drain regions and having a second height over the surface, wherein the first height is substantially greater than the second height.

3. The semiconductor device of claim 1 wherein:
a wide-spacer one of the NMOS and PMOS devices includes a first gate interposing associated source/drain regions and first spacers on opposing sides of the first gate, the first spacers each extending from the first gate to a first width; and
a narrow-spacer one of the NMOS and PMOS devices includes a second gate interposing associated source/drain regions and second spacers on opposing sides of the second gate, the second spacers each extending from the second gate to a second width, wherein the first width is substantially greater than the second width.

4. The semiconductor device of claim 2 wherein:
a wide-spacer one of the NMOS and PMOS devices includes first spacers on opposing sides of an associated one of the first and second gates, the first spacers each extending from the associated gate to a first width; and a narrow-spacer one of the NMOS and PMOS devices includes second spacers on opposing sides of an associated one of the first and second gates, the second spacers each extending from the associated gate to a second width, wherein the first width is substantially greater than the second width.

5. The semiconductor device of claim 1 wherein at least one set of the first and second source/drain regions comprises SiGe.

6. The semiconductor device of claim 1 wherein at least one set of the first and second source/drain regions comprises SiC.

7. The semiconductor device of claim 6 wherein at least one set of the first and second source/drain regions comprise SiGe.

8. The semiconductor device of claim 1 wherein the substrate has a <110> crystal orientation.

9. The semiconductor device of claim 1 wherein the substrate has a <100> crystal orientation.

10. The semiconductor device of claim 1 wherein the substrate is a silicon-on-insulator substrate.

11. The semiconductor device of claim 1 wherein the substrate is a bulk silicon substrate.

12. The semiconductor device of claim 1 wherein at least one set of the first and second source/drain regions comprises strained source/drain regions.

13. The semiconductor device of claim 2 wherein at least one set of the first and second source/drain regions comprises strained source/drain regions.

14. The semiconductor device of claim 3 wherein at least one set of the first and second source/drain regions comprises strained source/drain regions.

15. A semiconductor device, comprising:
an isolation region located in a substrate;
an NMOS device located partially over a surface of the substrate; and
a PMOS device isolated from the NMOS device by the isolation region and located partially over the surface;
wherein a first one of the NMOS and PMOS devices includes:
  first source/drain regions recessed within the substrate; and
  a first gate interposing the first source/drain regions and having a first gate height over the surface, wherein the first source and drain regions are disposed entirely below an imaginary plane extending from the interface of the first gate and the substrate, and wherein a top surface of the first source/drain region lies below the imaginary plane; and
wherein a second one of the NMOS and PMOS devices includes:
  second source/drain regions at least partially extending above the surface, and extending at least partially above the imaginary plane extending from the interface of the second gate and the substrate; and
  a second gate interposing the second source/drain regions and having a second gate height over the surface, wherein the first and second gate heights are substantially different, and
  an etch stop layer overlying the first gate, the second gate, the first source/drain regions and the second source/drain regions, wherein the etch stop layer extends below the imaginary plane extending from the interface of the first gate and the substrate.

16. The semiconductor device of claim 15 wherein:
a wide-spacer one of the NMOS and PMOS devices includes first spacers on opposing sides of an associated gate, the first spacers each extending from the associated gate to a first width; and
a narrow-spacer one of the NMOS and PMOS devices includes second spacers on opposing sides of an associated gate, the second spacers each extending from the associated gate to a second width, wherein the first width is substantially greater than the second width.

17. The semiconductor device of claim 15 wherein at least one set of the first and second source/drain regions comprises SiGe.

18. The semiconductor device of claim 15 wherein at least one set of the first and second source/drain regions comprises SiC.

19. The semiconductor device of claim 18 wherein at least one set of the first and second source/drain regions comprises SiGe.

20. The semiconductor device of claim 15 wherein the substrate has a <110> crystal orientation.

21. The semiconductor device of claim 15 wherein the substrate has a <100> crystal orientation.

22. The semiconductor device of claim 15 wherein the substrate is a silicon-on-insulator substrate.

23. The semiconductor device of claim 15 wherein the substrate is a bulk silicon substrate.

24. The semiconductor device of claim 15 wherein at least one set of the first and second source/drain regions comprises strained source/drain regions.

25. The semiconductor device of claim 16 wherein at least one set of the first and second source/drain regions comprises strained source/drain regions.

26. The semiconductor device of claim 15 wherein the etch stop layer contributes to the substantial magnitude difference between the first stress in the first source/drain regions and the second stress in the second source/drain regions.

27. A semiconductor device, comprising:
an isolation region located in a substrate;
an NMOS device located partially over a surface of the substrate; and
a PMOS device isolated from the NMOS device by the isolation region and located partially over the surface;
wherein a first one of the NMOS and PMOS devices includes:
  first source/drain regions recessed within the substrate, wherein a first contact coupled to the first source/drain region extends below the surface of the substrate;
  a first gate interposing the first source/drain regions and disposed on the surface of the substrate thereby providing a first interface between the substrate and the first gate; and
  first spacers on opposing sides of the first gate and each extending from the first gate to a first width; and
wherein a second one of the NMOS and PMOS devices includes:
  second source/drain regions at least partially extending above the surface;
  a second gate interposing the second source/drain regions an disposed on the surface of the substrate thereby providing a second interface between the substrate and the second gate; and
  second spacers on opposing sides of the second gate and each extending from the second gate to a second width, wherein the first and second widths are substantially different; and an etch stop layer overlying the NMOS and PMOS device wherein the etch stop layer extends below the first interface, wherein the etch stop layer is at least one of a tensile film and a compressive film.

28. The semiconductor device of claim 27 wherein at least one set of the first and second source/drain regions comprises SiGe.

29. The semiconductor device of claim 27 wherein at least one set of the first and second source/drain regions comprises SiC.

30. The semiconductor device of claim 29 wherein at least one set of the first and second source/drain regions comprises SiGe.

31. The semiconductor device of claim 27 wherein the substrate has a <110> crystal orientation.

32. The semiconductor device of claim 27 wherein the substrate has a <100> crystal orientation.

33. The semiconductor device of claim 27 wherein the substrate is a silicon-on-insulator substrate.

34. The semiconductor device of claim 27 wherein the substrate is a bulk silicon substrate.

35. The semiconductor device of claim 27 wherein at least one set of the first and second source/drain regions comprises strained source/drain regions.

36. The semiconductor device of claim 27 wherein the etch stop layer contributes to the substantial magnitude difference between the first stress in the first source/drain regions and the second stress in the second source/drain regions.

37. A method of manufacturing a semiconductor device, comprising:
    forming an isolation region located in a substrate;
    forming an NMOS device located partially over a surface of the substrate; and
    forming a PMOS device isolated from the NMOS device by the isolation region and located partially over the surface;
    wherein the forming of a first one of the NMOS and PMOS devices includes:
        etching a recesses in the substrate, and forming a first source/drain regions within the recess, wherein the entire first source/drain region is recessed within the surface and lies entirely below the surface; and
    wherein the forming of a second one of the NMOS and PMOS devices includes forming second source/drain regions at least partially extending above the surface; and
forming an etch stop layer over the NMOS device and the PMOS device, wherein a portion of the etch stop layer overlies the first source/drain region and extends into the recesses.

38. The method of claim 37 wherein:
a high-gate one of the NMOS and PMOS devices includes a first gate interposing associated source/drain regions and having a first height over the surface; and
a low-gate one of the NMOS and PMOS devices includes a second gate interposing associated source/drain regions and having a second height over the surface, wherein the first height is substantially greater than the second height.

39. The method of claim 37 wherein:
a wide-spacer one of the NMOS and PMOS devices includes a first gate interposing associated source/drain regions and first spacers on opposing sides of the first gate, the first spacers each extending from the first gate to a first width; and
a narrow-spacer one of the NMOS and PMOS devices includes a second gate interposing associated source/drain regions and second spacers on opposing sides of the second gate, the second spacers each extending from the second gate to a second width, wherein the first width is substantially greater than the second width.

* * * * *